(12) United States Patent
Reisinger et al.

(10) Patent No.: US 7,018,224 B2
(45) Date of Patent: Mar. 28, 2006

(54) CHARGE-CONTROLLING SYSTEM

(75) Inventors: Jason M'Cheyne Reisinger, Carlisle, PA (US); Robert Allen Kirker, Harrisburg, PA (US); Keith McQuilkin Murr, Etters, PA (US); Dean Camiel William Vermeersch, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/447,875

(22) Filed: May 22, 2003

(65) Prior Publication Data

US 2004/0235326 A1    Nov. 25, 2004

(51) Int. Cl.
*H01R 13/53*    (2006.01)
(52) U.S. Cl. ...................................... 439/181; 439/951
(58) Field of Classification Search ................ 439/181, 439/183, 908, 924, 947, 951
See application file for complete search history.

(56) References Cited

U.S. PATENT DOCUMENTS

| 4,532,419 | A | * | 7/1985 | Takeda ........................ 439/181 |
| 4,681,549 | A | * | 7/1987 | Peterson ...................... 439/181 |
| 5,319,523 | A | * | 6/1994 | Ganthier et al. ............. 361/753 |
| 6,559,649 | B1 | * | 5/2003 | Deleu et al. ................. 324/457 |
| 2004/0014344 | A1 | * | 1/2004 | Yamamoto .................. 439/181 |

FOREIGN PATENT DOCUMENTS

JP    02294092 A    * 12/1990

* cited by examiner

*Primary Examiner*—P. Austin Bradley
*Assistant Examiner*—X. Chung-Trans

(57) ABSTRACT

A bifurcated conductive pad positioned on an electrical mating component, such as a circuit card, a contact portion of a cable assembly, or the like, having a main body and a mating edge. The bifurcated conductive pad receives a mating element having a built-up charge. The conductive pad comprises an initial contact portion and a final contact portion. The initial contact portion is configured to receive the mating element before the final contact portion receives the mating element, and wherein at least one of the initial and final contact portions is grounded so that the final contact portion receives a reduced amount of the built-up charge.

16 Claims, 7 Drawing Sheets

CHARGE-CONTROLLING SYSTEM

BACKGROUND OF THE INVENTION

Certain embodiments of the present invention generally relate to conductive pads or contacts of electronic circuit cards, electrical cable assemblies, electrical components and the like, and more particularly to conductive pads that protect against electrical and electrostatic charge and build up on electrical elements that are mated with the conductive pads.

Various electronic systems, such as computers, comprise a wide array of components mounted on circuit boards, such as daughtercards and motherboards that are interconnected to transfer signals and power throughout the systems. Circuit cards having mating contacts are used to transfer signals and power between the circuit boards and other components of the systems. Various cable assemblies are used as well to transfer signals between components.

Figure 1:
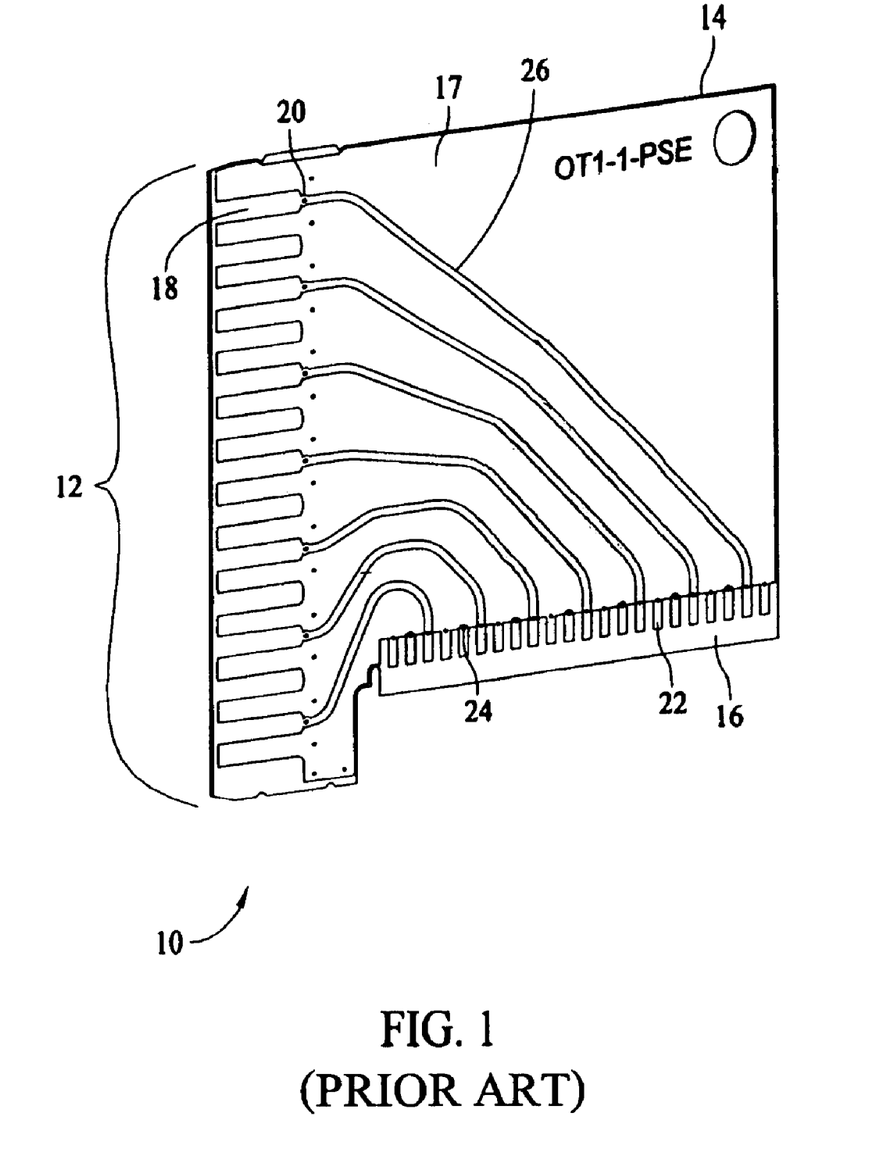
FIG. 1 illustrates an isometric view of a conventional circuit card configured to be mounted in a connector housing.

FIG. 1 is an isometric view of a conventional circuit card 10 housed in a connector to interconnect circuit boards and other components. The circuit card 10 includes a mating edge 12, a top edge 14 and a channel edge 16 defining a main body 17 therebetween. The circuit card 10 includes a plurality of conductive pads 18 (signal and ground conductive pads) arranged along the mating edge 12 of the main body 17. Conductive pads 22 (ground and signal pads) are arranged along the channel edge 16 of the main body 17. Traces 26 connect corresponding conductive pads 18 and 22. The traces 26 are staggered on opposite sides of the circuit card 10 and connected to corresponding conductive pads 18 and 22 through vias 20 and 24, respectively. The traces 26 may also be positioned to electrically connect two or more vias 20 or 24.

The channel edge 16 is received and retained within a channel of a connector housing (not shown). Typically, contact pins (not shown) engage the conductive pads 22 through cavities within the channels. Also, contacts (not shown) electrically connect conductive pads 18 on one circuit card 10 to conductive pads 18 on another circuit card 10.

Different types of circuit cards, which may be used in various applications, are known in the art. The circuit cards may be housed or retained in a wide variety of housings. The circuit card 10 is merely an example of a typical circuit card having conventional conductive pads 18 and 22. Typically, conductive pads 18 and 22, which may be used on circuit cards and on other electrical components, are single unitary conductive pieces directly connected to traces 26.

In order to establish electrical contact with the circuit card, a mating element of a corresponding circuit board or electrical component contacts the conductive pad. Often, electrostatic or other electrical energy builds up in the mating element. Often, an electrical charge may arc from the mating element to the circuit card. Also, when the mating element initially contacts the conductive pad, electrostatic energy built up on the mating element is discharged into the conductive pad. The electrostatic or electrical charge travels from the conductive pad through the electrical path emanating from the conductive pad. Typically, the electrical path leads to another component. The circuitry of the component, however, may not be able to handle the surge of electrostatic energy. Often, the electrostatic or electrical charge, or surge, may degrade or destroy the circuitry of components within an electrical system.

Thus, a need exists for a conductive pad that protects against the harmful effects of an electrostatic discharge.

BRIEF SUMMARY OF THE INVENTION

Certain embodiments of the present invention provide a circuit card or electrical mating component having a conductive pad configured to join a mating element having a charge build-up. The conductive pad comprises first and second contact portions separate and distinct from one another and a charge-controlling device. The first contact portion is configured to receive the mating element before the second contact portion receives the mating element. The charge-controlling device is connected to the first contact portion to establish an electrical path in which the charge build-up is discharged through the charge-controlling device. The charge-controlling device may be surface mounted, or positioned within the circuit card or electrical mating component.

Certain embodiments of the present invention also provide a bifurcated conductive pad positioned on a circuit card having a main body and a mating edge. The bifurcated conductive pad receives a mating element having a built-up charge. The conductive pad comprises an initial contact portion and a final contact portion, wherein the initial contact portion is configured to receive the mating element before the second contact portion receives the mating element. At least one of the initial and final contact portions is grounded so that the final contact portion receives a reduced amount of the built-up charge. Certain embodiments of the present invention also provide a circuit board comprising a main body and a charge-controlling conductive pad system. The charge-controlling conductive pad system includes at least one surface mount pad positioned on said main body; and a resistor mounted on said at least one surface mount pad, wherein said at least one surface mount pad is connected to ground

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentalities shown in the attached drawings.

DETAILED DESCRIPTION OF THE INVENTION

Figure 2:
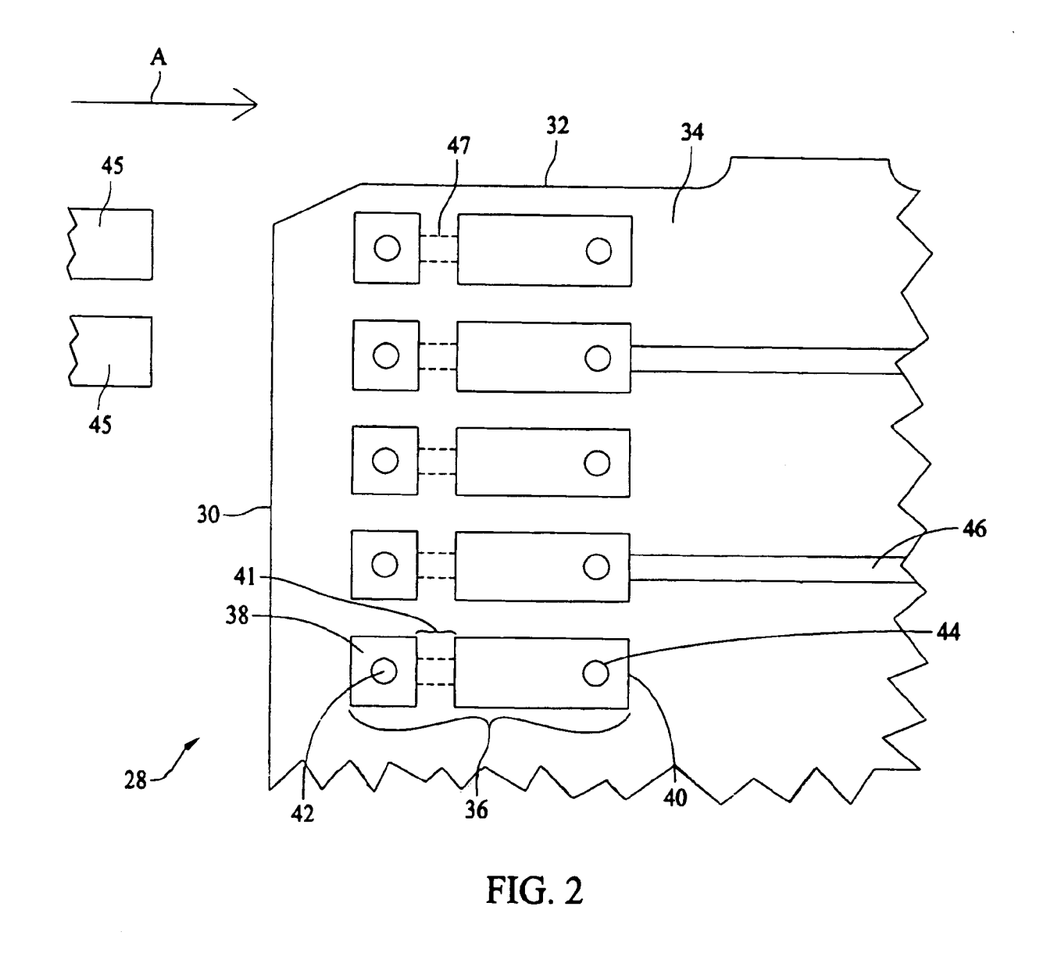
FIG. 2 illustrates a side view of a circuit card formed according to an embodiment of the present invention.

FIG. 2 illustrates a side view of a circuit card 28 according to an embodiment of the present invention. One or more circuit cards 28 may be mounted in connector housings having a variety of shapes and sizes. The circuit card 28 includes a mating edge 30, a top edge 32, a back edge (not shown) and a bottom edge (not shown) that define a main body 34. The circuit card 28 also includes a plurality of charge-controlling pads 36, which may be signal or ground pads. The charge-controlling pads 36 may be used to control electrical charges exchanged between the circuit cards 28 and matable components during mating. For example, the charge-controlling pads 36 may control electrostatic discharge (ESD) from a mating element to the circuit card 28. The charge-controlling pads 36 are bifurcated pads in that they include an initial contact portion 38 and a final contact portion 40 separated by a gap 41 of non-conductive circuit board material. The initial contact portion 38 and the final contact portion 40 include vias 42 and 44, respectively, that interconnect parallel initial and final contact portions 38 and 40 located on opposite sides of the circuit card 28. The final contact portions 40 may be connected to traces 46, which provide an electrical connection to other conductive pads, electrical components, etc., on the circuit card 28.

It is to be understood that the charge-controlling pads 36 may be used with circuit cards, or any elements or component that have a conductive surface that is mated with another conductive surface. That is, the charge-controlling pads 36 may be used within electrical connectors, electrical cable assemblies, chassis assemblies, motherboards, daughtercards, and various other electrical components in which electrical mating between two elements is needed. For example, the charge controlling pads 36 may be utilized with electrical cable assemblies such as those disclosed in U.S. Pat. No. 5,766,027, issued to Fogg (the '027 patent), which is herein incorporated by reference in its entirety. The charge-controlling pads 36 may be used on, or as, contact portions of the electrical cable assemblies disclosed within the '027 patent.

Figure 3:
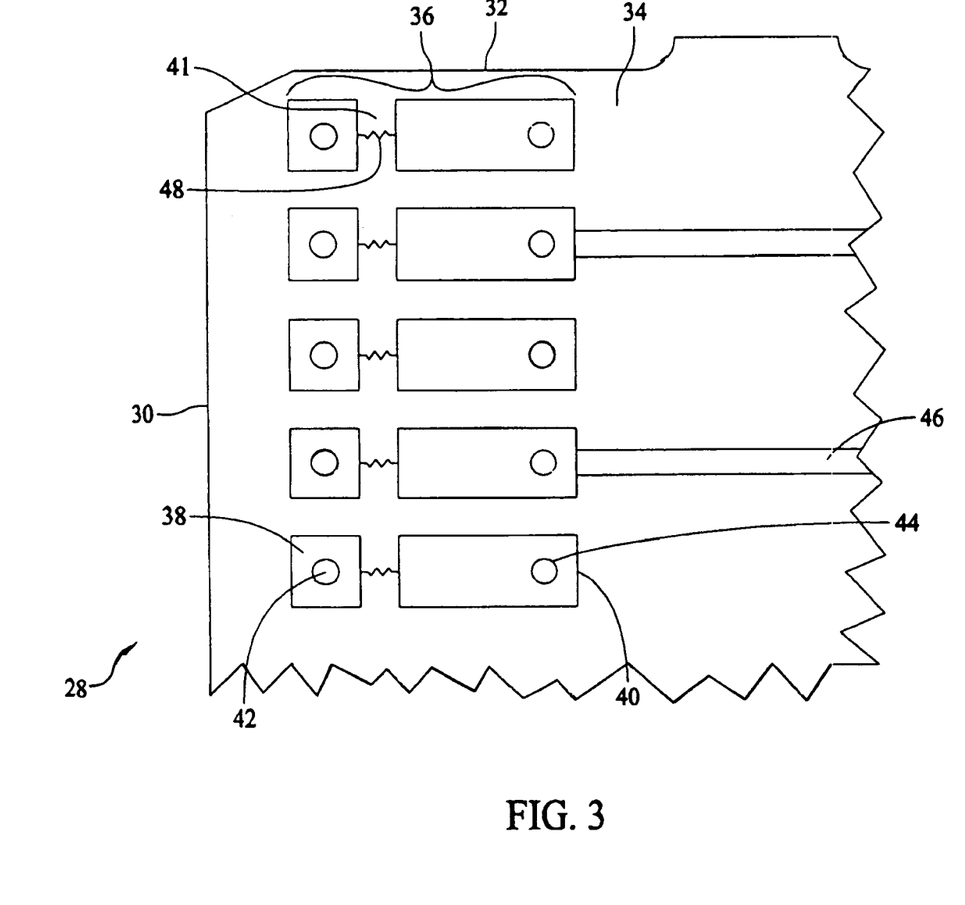
FIG. 3 illustrates a side view of a portion of a circuit card formed according to an embodiment of the present invention.
Figure 4:
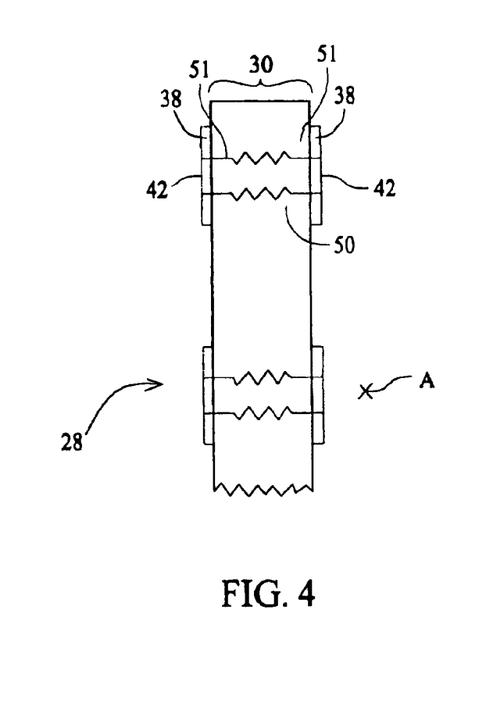
FIG. 4 illustrates a partial end view of a mating edge of a circuit card formed according to an embodiment of the present invention.
Figure 5:
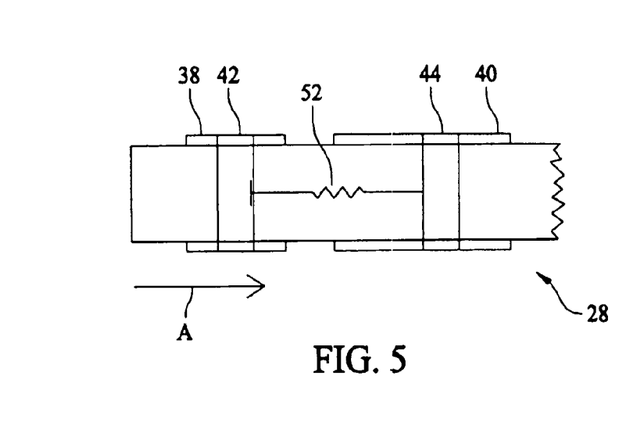
FIG. 5 illustrates a partial plan view of a top edge of a circuit card formed according to an embodiment of the present invention.

A charge-controlling device 47, such as a resistor, is positioned within or on the surface of the circuit card 28 proximate the gap 41. The charge-controlling device 47 may be connected to the initial and final contact portions 38 and 40 through traces. The initial contact portion 38 and the final contact portion 40 may be electrically connected through the charge-controlling device 47. A variety of charge-controlling devices 47 may be used depending on the configuration. FIGS. 3–5 show exemplary configurations for charge-controlling devices 47. The charge-controlling device 47 may be surface mounted or deposited (such as a carbon deposit on a thick film circuit board) on the circuit card 28 between the initial contact portion 38 and the final contact portion 40. Alternatively, the charge-controlling device 47 may be embedded within the circuit card 28. The charge-controlling device 47 may be any suitable material that safely and efficiently resists a predetermined voltage threshold.

In operation, an electrically conductive mating element 45, such as a terminal contact, is moved along the direction of arrow A to mate with the charge-controlling conductive pad 36 such that the mating element 45 engages the initial contact portion 38 before engaging the final contact portion 40. That is, the mating process includes two stages, namely an initial mating stage and a final mating stage.

During the initial mating stage, the mating element 45 may discharge an electrostatic surge or spike, which has been stored on or within the mating element 45 and/or circuitry connected thereto. Also, an electrical surge, such as a power signal, may arc from the mating element to the charge-controlling pad 36. The electrostatic or electrical surge travels from the initial contact portion 38 into the via 42. The electrostatic or electrical surge then travels through the via 42 to a trace (not shown) connected to the charge-controlling device 47, which impedes, diminishes, attenuates or otherwise resists the flow of the electrostatic or electrical surge. A diminished electrical signal then travels from the charge-controlling device 47 to a trace that is electrically connected to the via 44 of the final contact portion 40.

Optionally, the initial contact portion 38 may not be electrically connected to the final contact portion 40. Instead, the via 42 may be electrically connected to a trace and the charge-controlling device 47, which in turn is electrically grounded through a trace. The grounding trace need not be electrically connected to any portion of the final contact portion 40. Thus, as the mating element 45 is slid or otherwise moved into position over the charge-controlling conductive pad 36, an electrostatic or other electrical charge is received by the initial contact portion 38, and discharged through the charge-controlling device 47. Hence, the full electrostatic or electrical charge is not introduced onto the final contact portion 40, where the electrical path from the initial contact portion 38 is grounded. Because the initial contact portion 38 is grounded, the charge-controlling conductive pad 36, and consequently the circuit card 28, does not store or experience excess charge. As the mating element 45 is moved beyond the initial mating position into a final mating position over the final contact portion 40, the possibility of an electrostatic or other electrical surge traveling from the final contact portion 40 to any electrically connected component is minimized due to the mating element 45 first discharging an electrostatic or other electrical charge through the initial contact portion 38.

FIG. 3 illustrates a sectional view of the circuit card 28 according to an alternative embodiment of the present invention. The charge-controlling conductive pads 36 may include a charge-controlling device 48, such as a resistor, surface mounted on gap 41 and connecting the initial contact portion 38 to the final contact portion 40. In this embodiment, the initial contact portion 38 need not be grounded. Instead, the resistive qualities of the charge-controlling device 48 are sufficient to adequately dissipate the electrostatic or other electrical charge between the initial contact portion 38 and the final contact portion 40.

FIG. 4 illustrates an end view of a portion of a circuit card 28 formed according to an alternative embodiment of the present invention. As shown in FIG. 4, the arrow A (depicted by X) is oriented into the page. The initial contact portions 38 and final contact portions 40 (shown in FIG. 3) are positioned proximate the mating edge 30 on the sides of the circuit card 28 such that a charge-controlling device 50 (such as a resistor) and trace segments 51 provide an electrical path between each side of the initial and final contact portions 38 and 40, respectively. The charge-controlling device 50 may be positioned in, or formed integrally with, vias 42 (and also vias 44). The electrical path including the charge-controlling device 50 may also be grounded.

FIG. 5 illustrates a partial plan view of a top edge of a circuit card formed according to an alternative embodiment of the present invention. The initial and final contact portions 38 and 40 are positioned on the sides of circuit card 28 such that the vias 42 and 44 provide an electrical path between each side of the circuit card 28. A charge-controlling device 52, such as a resistor, may be positioned between the via 42 of the initial contact portion 38 and the via 44 of the final contact portion 40. Additionally, the electrical path including the charge-controlling device 52 may be grounded.

Figure 6:
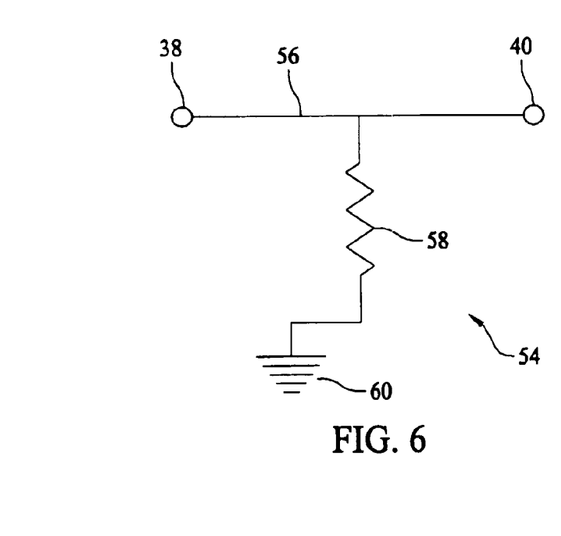
FIG. 6 illustrates a schematic diagram representative of a charge-controlling system according to an embodiment of the present invention.

FIG. 6 illustrates a schematic diagram representative of a charge-controlling system 54 according to an embodiment of the present invention. The system 54 includes initial and final contact portions 38 and 40 connected by way of a trace 56. The trace 56 is in turn electrically connected to a charge-controlling device 58, which is in turn connected to ground 60 (that is, the charge-controlling device 58 is grounded). Electrostatic or other electrical surges or spikes travel from the initial contact portion 38 into the charge-controlling device 58 (such as a resistor). The electrostatic or electrical surges or spikes are dissipated by the charge-controlling device 58 and then passed to ground 60.

Optionally, more than one charge-controlling device may be used within the conductive pad 36. For example, one charge-controlling device may be positioned between the initial contact portion 38 and the ground, while another charge-controlling device may be positioned between the initial contact portion 38 and the final contact portion 40. Also, multiple ESD-controlling devices may be positioned within a single electrical path. For example, two ESD-controlling devices may be positioned in series or in parallel between the initial contact portion 38 and the ground.

Additionally, the conductive pad 36 may be bifurcated into more than two parts. That is, the conductive pad 36 may include an initial, intermediate and final contact portions. Further, a plurality of intermediate contact portions may be positioned between the initial and final contact portions. The intermediate contact portions, similar to the initial contact portions, may be grounded and/or connected to the final contact portions through charge controlling devices and/or traces.

Figure 7:
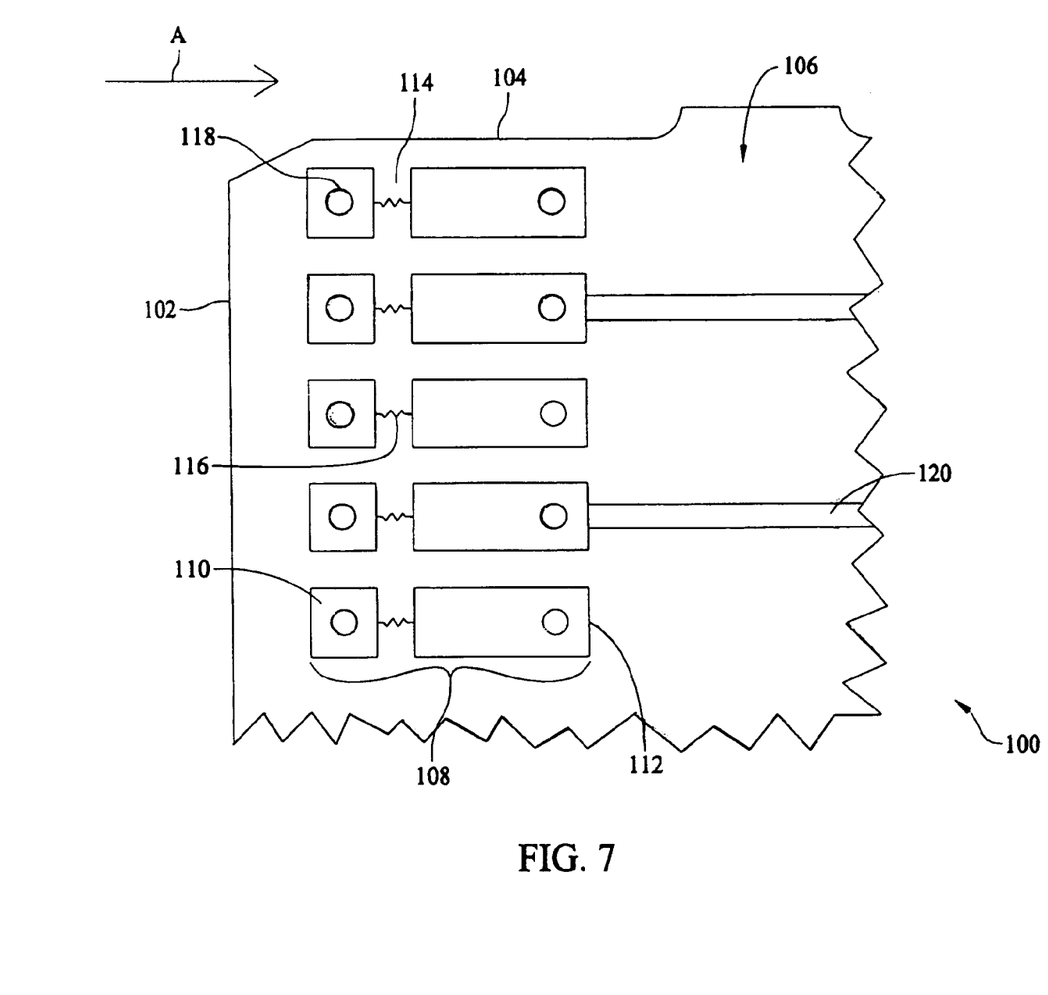
FIG. 7 illustrates a side view of a circuit card formed according to an alternative embodiment of the present invention.

FIG. 7 illustrates a side view of a circuit card 100 formed according to an alternative embodiment of the present invention. One or more circuit cards 100 may be mounted in connector housings having a variety of shapes and sizes. The circuit card 100 includes a mating edge 102, a top edge 104, a back edge (not shown) and a bottom edge (not shown) that define a main body 106. The circuit card 100 also includes a plurality of charge-controlling pads 108. The charge-controlling pads 108 include an initial contact portion 110 and a final contact portion 112 separated by a gap 114. A surface mounted resistor 116 is disposed within the gap 114 and connects the initial contact portion 110 to the final contact portion 112. The initial contact portion 110 includes a via 118. The via 118 interconnects the initial contact portion 110 to a ground plane (shown with respect to FIG. 8) located on the opposite side of the circuit card 100. The final contact portions 112 may be connected to traces 120, which provide an electrical connection to other conductive pads, electrical components, etc., on the circuit card 100.

The charge-controlling pads 108 may be utilized with electrical cable assemblies such as those disclosed in the '027 patent. The charge-controlling pads 108 may be used on, or as, contact portions of the electrical cable assemblies disclosed within the '027 patent.

A variety of charge-controlling devices 116 may be used depending on the configuration. For example, the charge controlling devices 116 may be 1.0 to 10.0 MOhm resistors. In this way, when a mating element (such as mating element 45 shown with respect to FIG. 2) contacts the initial contact portion 110, any electrostatic discharge from the mating element travels from the initial contact portion 110 to the ground plane through the via 110. Further, electrostatic charge is dissipated by shorting the final contact portions 112 to the ground plane through the charge-controlling devices 116

Figure 8:
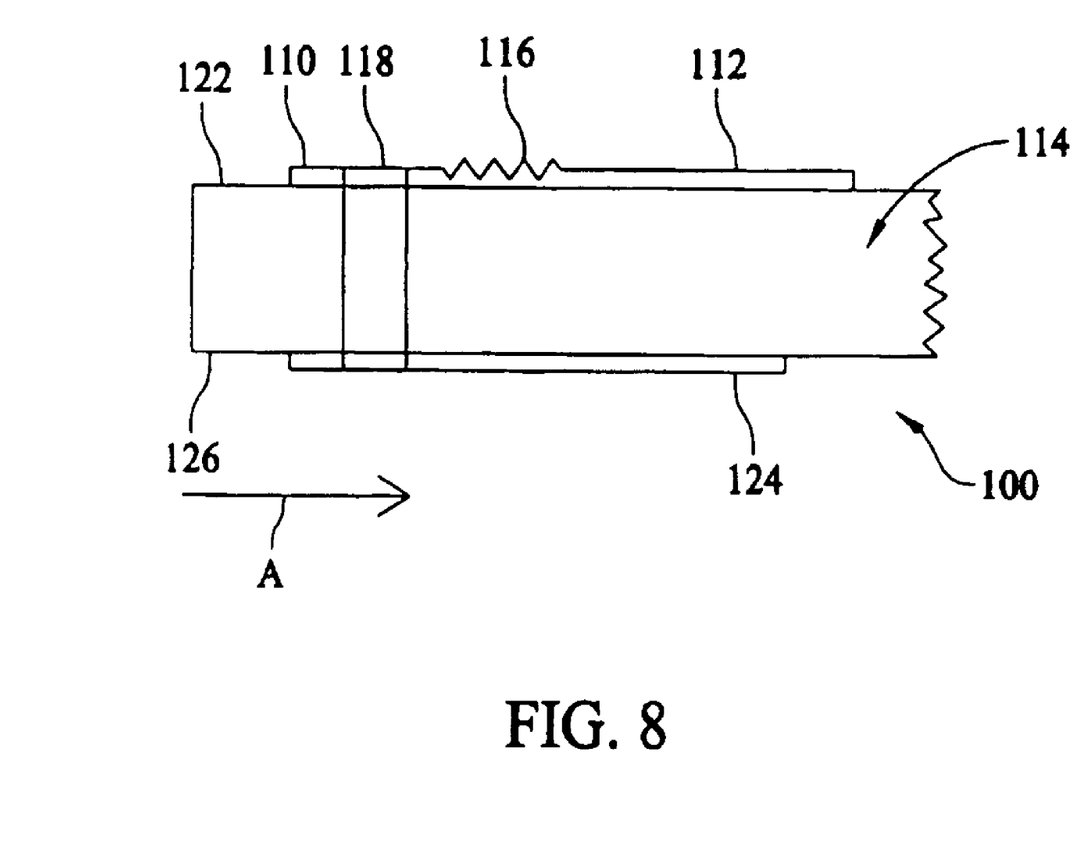
FIG. 8 illustrates a partial plan view of a top edge of a circuit card formed according to an alternative embodiment of the present invention.

FIG. 8 illustrates a partial plan view of the top edge 114 of the circuit card 100 formed according to an alternative embodiment of the present invention. The initial contact portion 110 on a first side 122 of the circuit card 100 is electrically connected to a ground plane 124 on the second side 126 through the via 118. As shown in FIG. 8, the charge-controlling device 116 is surface mounted on the first side 122 and electrically connects the initial contact portion 110 to the final contact portion 112. Electrostatic charge does not build up on the circuit card 100 because any such charge is dissipated through the charge-controlling device 116, and/or passed to the ground plane 124. Optionally, no via 118 may connect the initial contact portion 110 to the ground plane 124. Instead, any electrostatic energy may be sufficiently dissipated through the charge-controlling device 116.

In general, embodiments of the present invention may be used with a variety of electrical components, such as electrical connectors, electrical cable assemblies and chassis assemblies. Embodiments of the present invention provide an improved conductive pad that may be used with electrical components that mate with other electrical components. Further, the bifurcated conductive pads provide electrical mating between electrical components that safeguards against electrostatic discharge (ESD), arcing, and other electrical spikes or surges from one component to the other.

Figure 9:
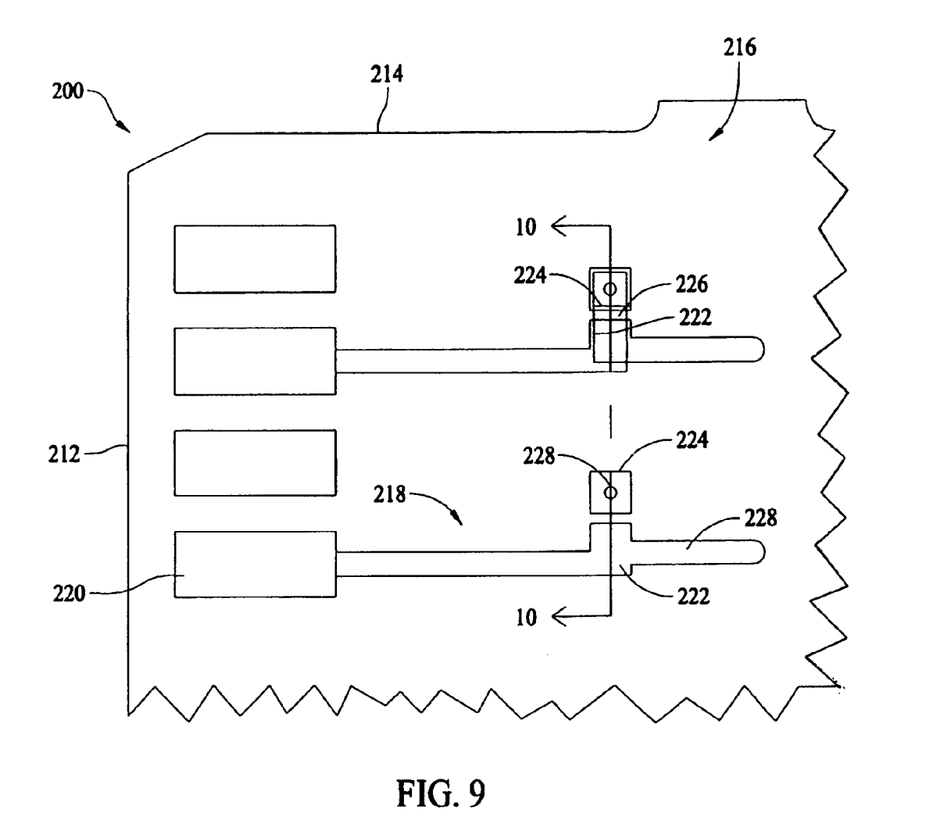
FIG. 9 illustrates a side view of a circuit card formed according to an alternative embodiment of the present invention.

FIG. 9 illustrates a side view of a circuit card 200 formed according to an alternative embodiment of the present invention. Circuit card 200 includes a mating edge 212, a top edge 214, a back edge (not shown) and a bottom edge (not shown) that define a main body 216. Circuit card 200 includes a charge controlling system 218 that includes a contact pad 220, a first surface mount pad 222, an additional surface mount pad 224, and a charge controlling device 226 surface mounted between surface mount pad 222 and surface mount pad 224. Surface mount pad 222 is also connected to a signal trace 227 on circuit card 200. In an exemplary embodiment, charge controlling device 226 is a resistor. Surface mount pad 224 includes a via 228 that connects surface mount pad 224 to a ground plane (see FIG. 10). The ground plane may be an internal layer of circuit card 200 and/or on the opposite surface of the circuit card 200. This embodiment provides for flexibility in the circuit layout since the charge controlling device 226 need not be immediately proximate the contact pad 220 or the card mating edge 212.

Figure 10:
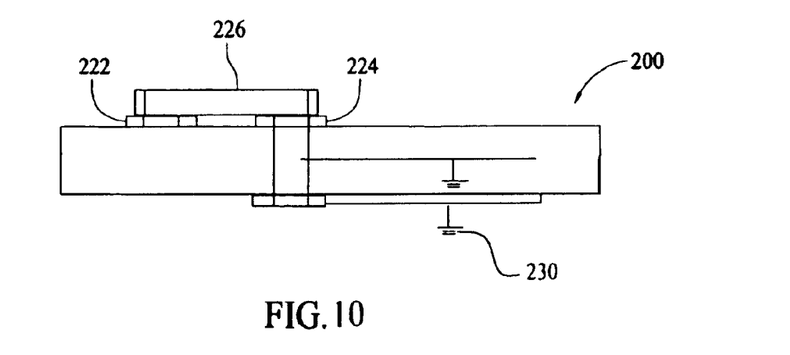
FIG. 10 illustrates a partial sectional view of the circuit card of FIG. 9 taken along line 10—10 in FIG. 9.

FIG. 10 illustrates a partial sectional view of the circuit card 200 of FIG. 9 viewed from the line of sight 10—10 in FIG. 9. The via 228 is shown extending through circuit card 200 and connecting surface mount pad 224 to ground at 230 at the surface of the circuit card 200 and/or alternatively at 232 representing an internal layer at ground within circuit card 200. Charge controlling device 226 is surface mounted between surface mount pads 222 and 224. Electrostatic charges are dissipated in charge controlling device 226 and/or passed to ground.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A circuit card having a conductive pad configured to join a mating element having a charge build-up as the mating element moves along a mating direction, said conductive pad comprising:
   first and second contact portions separated by a non-conducting gap, said first and second contact portions and said non-conducting gap being aligned in-line with one another on a common side of the circuit card and aligned along the mating direction such that said first contact portion is positioned to receive the mating element before said second contact portion receives the mating element; and
   a charge-controlling device connected to said first contact portion to establish an electrical path in which the charge build-up is discharged through said charge-controlling device, said charge-controlling device being positioned in said non-conducting gap between said first and second contact portions.

2. The circuit card of claim 1 wherein said electrical path is grounded.

3. The circuit card of claim 1 wherein said charge-controlling device is connected to said second contact portion so that a second electrical pat is established between said charge-controlling device and said second contact portion.

4. The circuit card of claim 1 wherein said charge-controlling device is a resistor, which is one of surface mounted in said non-conducting gap of the circuit card or positioned below the surface of said non-conducting gap, wherein said resistor is physically located between said first and second contact portions.

5. The circuit card of claim 1 wherein said first and second contact portions are positioned on a first side of said circuit card and are connected by said charge-controlling device, said charge-controlling device being surface mounted on said first side, and wherein at least one of said first and second contact portions is connected to a ground plane located on a second side of said circuit card.

6. The circuit card of claim 1, further comprising a plurality of said first and second contact portions, each of said first contact portions being separate and distinct from one another, each of said second contact portions being separate and distinct from one another.

7. A circuit card having a conductive pad configured to join a mating element having a charge build-up as the mating element moves along a mating direction, said conductive pad comprising:
   first and second contact portions separate and distinct from one another and aligned in-line with one another on a common side of the circuit card and aligned along the mating direction such that said first contact portion is positioned to receive the mating element before said second contact portion receives the mating element; and
   a charge-controlling device connected to said first contact portion to establish an electrical path in which the charge build-up is discharged through said charge-controlling device, wherein said first contact portion comprises a first via and said second contact portion comprises a second via, and wherein said charge-controlling device is positioned at one of i) below a surface of said circuit card and ii) on a side of said circuit card opposite to said common side, said charge-controlling device being connected to one of said first and second vias.

8. A circuit card having a conductive pad configured to join a mating element having a charge build-up as a mating element moves along a mating direction, said conductive pad comprising:
   first and second contact portions separate and distinct from one another and aligned in-line with one another on a common side of the circuit card and aligned along the mating direction such that said first contact portion is positioned to receive the mating element before said second contact portion receives the mating element; and
   a charge-controlling device connected to said first contact portion to establish an electrical path in which the charge build-up is discharged through said charge-controlling device, wherein said first contact portion comprises two conductive elements positioned on opposite sides of said circuit card and connected trough a via, and wherein said second contact portion comprises two conductive elements positioned on opposite sides of said circuit card and connected through a via.

9. A bifurcated conductive pad positioned on a circuit card having a main body, wherein said bifurcated conductive pad receives a mating element having a built-up charge as the mating element moves along a mating direction, said conductive pad comprising:
   an initial contact portion and a final contact portion located on a common side of the main body and aligned in-line with one another along the mating direction, wherein said initial contact portion is configured to receive the mating element before said final contact portion receives the mating element, and wherein at least one of said initial and final contact portions is grounded so that said final contact portion receives a reduced amount of the built-up charge; and
   a charge-controlling device electrically connected to said initial contact portion and ground, said charge-controlling device being positioned in a non-conducting gap located between said initial and final contact portions along the mating direction.

10. The bifurcated conductive pad of claim 9 wherein said charge-controlling device further comprises a resistor, which is one of surface mounted in said non-conducting gap of said circuit board and positioned below the surface of said non-conducting gap, wherein said non-conducting gap is defined between said initial and final contact portions.

11. The bifurcated conductive pad of claim 9 wherein said initial contact portion comprises two conductive elements positioned on opposite sides of said circuit card, and wherein said conductive elements of said initial contact portion are connected through a via.

12. The bifurcated conductive pad of claim 9 wherein said charge-controlling device is located proximate a mating edge of said circuit card.

13. The bifurcated conductive pad of claim 9 wherein said charge-controlling device includes a resistor that is surface mounted on a first side of said card connecting said initial contact portion and said final contact portion, said initial contact portion including a via electrically connecting said initial contact portion to a ground plane on a second side of said card.

14. A bifurcated conductive pad positioned on a circuit card having a main body, wherein said bifurcated conductive pad receives a mating element having a built-up charge as the mating element moves along a mating direction, said conductive pad comprising:
   an initial contact portion and a final contact portion located on a common side of the main body and aligned in-line with one another along the mating direction, wherein said initial contact portion is configured to receive the mating element before said final contact portion receives the mating element, and wherein at least one of said initial and final contact portions is grounded so that said final contact portion receives a reduced amount of the built-up charge; and
   a charge-controlling device electrically connected to said initial contact portion, wherein said initial contact portion comprises a first via, and wherein said charge-controlling device comprises a resistor positioned within said first via.

15. A circuit card having a conductive pad configured to join a mating element having a charge build-up as a mating element moves along a mating direction, said conductive pad comprising:
   first and second contact portions separate and distinct from one another and aligned in-line with one another on a first side of the circuit card and aligned along the mating direction such that said first contact portion is positioned to receive the mating element before said second contact portion receives the mating element;
   a charge-controlling device connected to said first contact portion to establish an electrical path in which the charge build-up is discharged through said charge-controlling device; and
   a ground plane internal to said circuit card and connected to said charge-controlling device.

16. A circuit card having a conductive pad configured to join a mating element having a charge build-up as the mating element moves along a mating direction, said conductive pad comprising:
   first and second contact portions separate and distinct from one another and aligned in-line with one another on a first side of the circuit card and aligned along the mating direction such that said first contact portion is positioned to receive the mating element before said second contact portion receives the mating element;
   a charge-controlling device connected to said first contact portion to establish an electrical path in which the charge build-up is discharged through said charge-controlling device; and
   a ground plane on a second side of said circuit card opposite said first side and connected to said charge-controlling device.

* * * * *